United States Patent [19]
Holländer et al.

[11] Patent Number: 5,814,158
[45] Date of Patent: Sep. 29, 1998

[54] METHOD OF CLEANING PROBE TIPS OF CARDS AND APPARATUS FOR IMPLEMENTING THE METHOD

[75] Inventors: Egon Holländer, Zürich; August Riedo, Dietikon, both of Switzerland

[73] Assignee: U.S. Philips Corporation, NY, N.Y.

[21] Appl. No.: 626,095

[22] Filed: Apr. 3, 1996

[30] Foreign Application Priority Data

Apr. 19, 1995 [EP] European Pat. Off. ............. 95200989

[51] Int. Cl.⁶ ................ C23G 1/02; B08B 3/04; B08B 3/08
[52] U.S. Cl. .................... 134/3; 134/2; 134/41; 134/137; 134/147; 134/164
[58] Field of Search ............... 134/2, 3, 41, 6, 134/47, 54, 135, 137, 902, 147, 164

[56] References Cited

U.S. PATENT DOCUMENTS

| | | | |
|---|---|---|---|
| 4,314,855 | 2/1982 | Chang et al. ................ | 134/3 |
| 4,319,923 | 3/1982 | Falanga et al. ............. | 75/108 |
| 4,590,422 | 5/1986 | Milligan ..................... | 324/158 F |
| 5,166,605 | 11/1992 | Daum et al. ................ | 324/158 F |
| 5,220,279 | 6/1993 | Nagasawa ................... | 324/158 P |
| 5,275,184 | 1/1994 | Nishizawa et al. .......... | 134/57 R |

FOREIGN PATENT DOCUMENTS 4-338662A 11/1992 Japan ................ H01L 21/66

*Primary Examiner*—W. Gary Jones
*Assistant Examiner*—Debra Shoemaker
*Attorney, Agent, or Firm*—Steven R. Biren

[57] ABSTRACT

A method of cleaning probe cards provided with probe tips, in which method the tips are cleaned of a contaminating material by exposing the tips to a cleaning solution by dipping in the solution such that only their ends touch the cleaning solution.

8 Claims, 1 Drawing Sheet

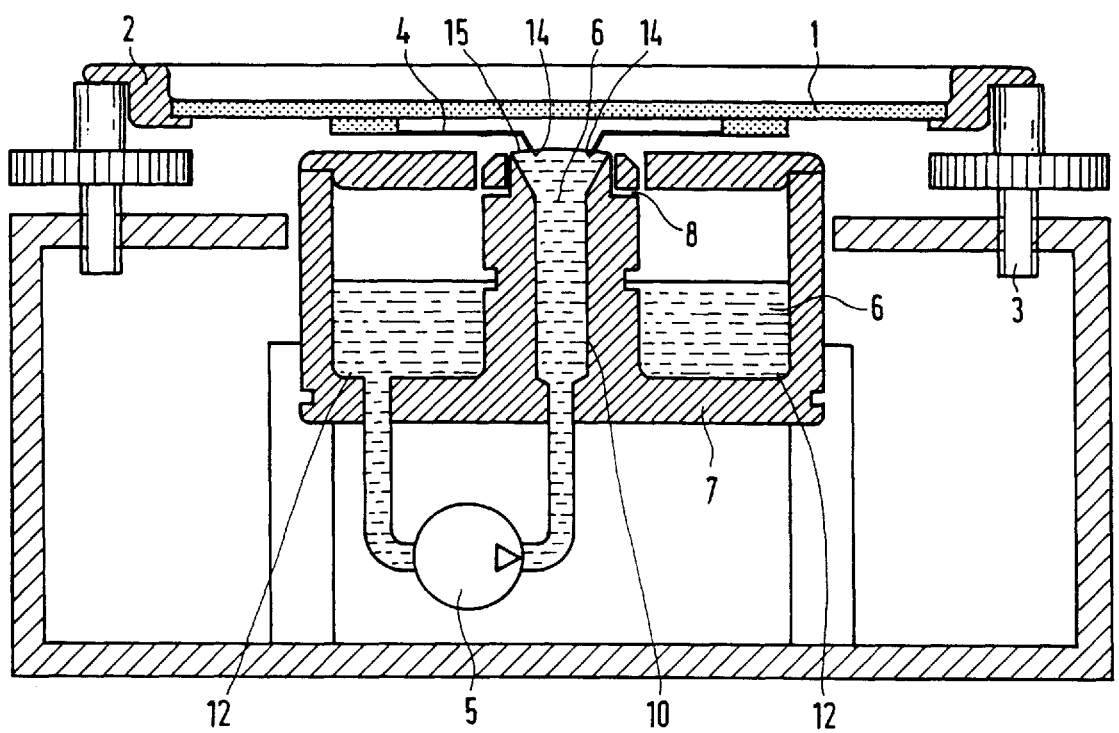

METHOD OF CLEANING PROBE TIPS OF CARDS AND APPARATUS FOR IMPLEMENTING THE METHOD

BACKGROUND OF THE INVENTION

The invention relates to a method of cleaning probe cards provided with probe tips for making electrical contact with test pads of electrical devices, in which method the tips are cleaned of a contaminating material through exposure of the tips to a cleaning solution. The invention also relates to an apparatus for implementing the method.

Probe cards are used for testing the electrical performance of electrical devices such as, for example, semiconductor devices or printed circuit boards. The probe cards are provided with probe tips which are placed on test pads of the devices. Probe cards are normally designed to fit a specific pattern layout of test pads. In practice, the probe cards show a degradation of performance with testing time. Therefore, these probe cards are cleaned from time to time so as to restore their original performance.

The English abstract of Japanese Patent Application JP-A-4-338662 discloses a method of the kind mentioned in the opening paragraph which uses a jet of a cleaning solution to regenerate a used probecard. In this known method, the probe tips are exposed to an acid or alkaline aqueous solution. The probe card is shielded from the jet by a cylindrical shielding member which is firmly adhered to the probe card by means of a resin layer.

The known method described has the disadvantage that the jet of cleaning solution contaminates the probe card despite the use of the shielding member. In practice the jet of solution is diverted by the probe tips and contaminates, for example, the bottom part of the probe card. Moreover, a satisfactory adherence of the shielding member to the resin layer is difficult to achieve, because if the adherence is too firm it is difficult to loosen the shielding member and if the adherence is relatively weak there is the risk that the solution creeps through a gap between resin layer and probe card and thus contaminates the probe card. It is also difficult in practice to clean the probe tips sufficiently with the jet.

SUMMARY OF THE INVENTION

The invention has for its object inter alia to counteract the disadvantages described.

According to the invention, therefore, the method is characterized in that the probe tips are dipped in the cleaning solution such that only their ends touch the cleaning solution.

It is achieved in this way that the probe cards can be cleaned without contaminating the probe card. Since only the probe tip ends are dipped in the cleaning solution, there is no need for a shielding member. Thus there are no problems associated with fastening or loosening of the shielding member.

The invention is based on the recognition that for a proper functioning of the probe card only the end of a probe tip needs to be cleaned. The jet of solution used in the known method cleans almost the entire length of the probe tip. Since the end of the tip is typically very small, it is difficult in the known method to clean the end of the tip by directing the solution jet to the end of the tip. The inventive method, on the contrary, uses a simple dipping process to clean the probe tips in those spots which are essential for making a good electrical contact, namely the ends of the tips.

Materials such as gold, silver, platinum, tungsten, palladium, copper/beryllium or molybdenum may be used for the probe tips. Materials such as, for example, gold, silver, copper, aluminium or solder are used for the test pads of the devices sometimes in the form of bumps. The probe tips and the test pads are made of different materials. It was found in practice that the contaminating material causing a bad electrical contact mainly originates from test pads. Material from the test pads then adheres to the probe tips. Although this material is in principle electrically conductive, the test pads being made of conductive material, it was discovered that oxidation and contamination of the material adhered to the probe tip can cause a bad electrical contact. According to the invention, a cleaning solution is used which does etch material used for the test pad, but does not etch (or etches only slightly) material used for the end of the probe tip. The invention is based on the recognition that it is sufficient to etch only the probe tips with an etchant for the material of the test pad in order to remove the oxidized and contaminated material from the probe tips, essentially without attacking the probe tip material. Etching can be done in an electroless or electrochemical way.

Preferably, probe cards are cleaned which have probe tips comprising tungsten. Tungsten is a very suitable material for a probe tip since it is very durable and makes a good electrical contact. The method is especially suited for the cleaning of a probe card used for contacting test pads comprising aluminium, so that the contaminating material comprises aluminium. Aluminium readily forms an insulating oxide. Preferably, the tips are dipped in a diluted aqueous cleaning solution of hydrogen fluoride (HF). Such a solution is a highly selective etchant for aluminium, whereas tungsten is not etched. Moreover, the cleaning solution can be applied electroless, i.e. there is no need to apply an electric current to the probe tip in order to clean it. The method is thus a very simple one to implement.

In a second preferred embodiment of the method, probe cards are cleaned which have probe tips comprising tungsten or palladium, while the contaminating material comprises gold. In this embodiment probe cards are cleaned which are used to measure test pads comprising gold. According to the invention, the contaminating material attached to the probe tips may be dissolved in a gold-etching solution based, for example, on cyanic or iodine chemistry, which solution does not attack the palladium or tungsten of the probe tips. Preferably, the tips are dipped in a cleaning solution containing iodine and potassium iodide dissolved in water. Such a solution gives a very good cleaning result without attacking the tungsten or palladium probe tips.

The invention also relates to an apparatus for cleaning probe cards provided with probe tips for making electrical contact with test pads of electrical devices, which apparatus is suited for cleaning the tips of a contaminating material by exposing the tips to a cleaning solution.

The English abstract of Japanese Patent Application JP-A-4-338662 discloses an apparatus of this kind. In this known apparatus, a jet of a cleaning solution is used to regenerate a probecard.

The known apparatus is difficult to use. For example, a shielding member has to be firmly adhered to the probe card by means of a resin layer. Moreover, the apparatus must generate a jet of cleaning solution which exposes all parts of probe tips to the cleaning solution. Such a jet must be very homogeneous or it must be precisely aimed at the probe tips.

The invention has for its object inter alia to provide an apparatus that is simple and easy to use.

According to the invention, therefore, the apparatus is characterized in that the apparatus comprises a support frame for the probecard and a container for the cleaning solution, which support frame is movable so as to move probe tips of the probe card towards the container. Such an apparatus is simple and easy to use. In use, the container is filled with the cleaning solution. The probe tips are then moved towards the cleaning solution, thus dipping the ends of the probe tips in the cleaning solution. Preferably, the apparatus is characterized in that there is an electronic circuit capable of giving an indication of an electrical contact between a probe tip and the cleaning solution. For that purpose, a probe tip and the cleaning solution are part of a simple electronic circuit, for example, connecting the probe tip electrically with the circuit and using an electrode in the cleaning solution as an electrical contact for the cleaning solution. When the probe tip touches the cleaning liquid, the circuit can detect an electrical contact between the probe tip and the cleaning solution and an indication lamp may display this situation. To contact all probe tips, which may not always be at the same height, a certain amount of extra movement of the support frame after the initial contact may be used to ensure that all probe tips are dipped in the cleaning solution. Preferably, the apparatus is characterized in that the container is connected by a pump to a reservoir for the cleaning solution, while the container is provided with an overflow connected to the reservoir. In use, the cleaning solution is pumped into the container from the reservoir. The container is for that purpose connected to the reservoir for the cleaning solution via the pump. The cleaning solution in the container is kept at a constant level in that the container has an overflow, for example in the form of a nozzle. Excess solution provided by the pump is thus transported back to the reservoir via the overflow. The constant level of the solution in the container allows for a very precise dipping of probe tips, even without the use of an electronic circuit to detect an electrical contact between a probe tip and the cleaning solution. The use of a pump and overflow has the additional advantage that the cleaning solution can be constantly refreshed, so that the cleaning process is more reproducible. The apparatus of the invention is easy to use. The probe card is placed on the support frame and the probe tips are dipped in the solution. There is no need to provide the probe card with a shielding member as in the known apparatus. Moreover, it is much easier to maintain a constant level of solution in a container than to provide a jet which exposes all parts of the probe tips to the cleaning solution.

BRIEF DESCRIPTION OF THE DRAWINGS

The invention will be explained in more detail below with reference to a drawing given by way of example. In the drawing, the single Figure shows a cross-section of an apparatus and a method for cleaning probe tips of probe cards.

DETAILED DESCRIPTION OF PREFERRED EMBODIMENTS

The figure shows an apparatus and a method for the cleaning of probe cards 1 provided with probe tips 4 for making electrical contact with test pads of electrical devices, in which method the tips 4 are cleaned of a contaminating material by exposing the tips 4 to a cleaning solution 6. Generally, the probe card 1 contains many probe tips 4. These probe tips 4 are generally bent and provided with sharp ends 14 so as to make an accurate positioning of the probe tips 4 on test pads possible. In the cleaning method, the probe card 1 is placed on a support frame 2. This support frame 2 is movable, so that it is possible to move the probe tips 4 of the probe card 1 towards a container 10 filled with the cleaning solution 6. According to the invention, the tips are dipped in the cleaning solution 6 in such a way that only their ends 14 touch the cleaning solution 6. To this end, the apparatus is provided with adjustable bolts 3. These bolts 3 restrict movement of the support frame 2 and thus of the probe tips 4. The bolts 3 are so adjusted that only the ends 14 can touch the cleaning solution 6. During application of the cleaning method the stage 2 is gently moved (lowered in the Figure) until the movement is restricted by the bolts 3. It is thus achieved that the probe cards 1 can be cleaned without contaminating the probe card. The invention is based on the recognition that only the end 14 of a probe tip 4 needs to be cleaned for a proper functioning of the probe card 1.

The cleaning solution 6 is transported by a pump 5 from the reservoir 12 with cleaning solution 6 to the container 10. The container 10 is for this purpose connected to the reservoir 12 with cleaning solution 6 via the pump 5. The cleaning solution 6 in the container 10 is kept at a constant level 15 in that the container 10 has an overflow nozzle 8. Excess solution 6 provided by the pump 5 is thus transported back to the reservoir 12 via the overflow nozzle 8. The constant level 15 of solution 6 in the container 10 renders a very precise dipping of probe tips 4 possible. The use of a pump 5 and overflow nozzle 8 has the additional advantage that the cleaning solution 6 is constantly refreshed, so that the cleaning process is more reproducible. For occasional cleaning a more simple arrangement without pump (static cleaning) is acceptable. In this case an electronic circuit which can give an indication of an electrical contact between a probe tip and the cleaning solution is especially advantageous.

As an example, the cleaning procedure for probe cards 1 with tungsten probe tips 4 used for testing semiconductor devices with aluminium test pads is described. According to the invention, a cleaning solution 6 is used which does etch material used for the test pad, in this example aluminium, but does not etch material used for the end of the probe tip, in this example tungsten. The invention is based on the recognition that it is sufficient to etch the probe tip ends 14 with an etching solution for material of the test pad to remove the contaminated material from the probe tip ends 14.

In this example the tungsten tip ends 14 are dipped for 5 minutes in an aqueous 5% hydrogen fluoride solution 6. Such a solution is a very selective etchant for aluminium, whereas tungsten is not etched. After removal of the contaminating material, the tips 4 are washed with water in a second apparatus (not shown here, but with the same layout as the apparatus of the figure, while clean water is supplied instead of the cleaning liquid) and dried by blowing dry air over the tips. After this the original performance of the probe card has been restored and the probe card is ready again for testing devices.

In a second embodiment, the cleaning of palladium or tungsten probe tips 4 for measuring gold bumps is described. Cleaning is performed in the apparatus of the figure but with a different cleaning solution 6. The material attached to the probe tips 4 may be dissolved in any known gold etch solution based, for example, on cyanic or iodine chemistry, which solution does not attack the palladium or tungsten of the probe tips 4. As an example, an aqueous solution 6 of potassium iodide and iodine is used, in this example 1 part by weight of iodine and 3 part by weight of potassium iodide dissolved in 10 part by weight of water. To remove the contaminating material selectively from the probe tips, the ends 14 of the probe tips 4 are dipped for 15 minutes in the cleaning solution 6 in the apparatus of the figure. Then the tips are washed with water and dried as in the previous embodiment. After this the original performance of the probe card has been restored and the probe card is ready again for testing devices.

It will be clear that the embodiment represented in the description is merely meant to illustrate the invention and that variations are possible within the scope of the invention. For example, if probe tips made from a material other than tungsten and if test pads made from a material other than aluminium are used, it is easy for those skilled in the art to determine which cleaning solution to take by taking as the cleaning solution an etchant which etches the material of the test pads, but not or only slightly the material of the probe tips.

What is claimed is:

1. A method of cleaning probe cards provided with probe tips for making electrical contact with test pads of electrical devices, in which method the tips are cleaned of a contaminating material through exposure of the tips to a cleaning solution, comprising the steps of maintaining an upper surface of the cleaning solution at a substantially constant and controlled level, and dipping the probe tips in the cleaning solution such that only their ends touch the cleaning solution.

2. A method as claimed in claim 1, characterized in that a cleaning solution is used which does etch material used for the test pad, but does not etch, or etches only slightly, material used for the end of the probe tip.

3. A method as claimed in claim 2, characterized in that probe cards are cleaned which have probe tips comprising tungsten, while the contaminating material comprises aluminium and the tips are dipped in a diluted aqueous cleaning solution of hydrogen fluoride.

4. A method as claimed in claim 2, characterized in that probe cards are cleaned which have probe tips comprising tungsten or palladium, while the contaminating material comprises gold and the tips are dipped in a cleaning solution containing iodine and potassium iodide dissolved in water.

5. An apparatus for cleaning probe cards provided with probe tips for making electrical contact with test pads of electrical devices, which apparatus is suited for cleaning the tips of a contaminating material by exposing the tips to a cleaning solution, characterized in that the apparatus comprises a support frame for the probe card and a container for the cleaning solution, which container comprises means for maintaining an upper surface of the cleaning solution at a substantially constant and controlled level which support frame is movable so as to move probe tips of the probe card toward the container and means for dipping the probe tips in the cleaning solution.

6. An apparatus as claimed in claim 5, characterized in that an electronic circuit is capable of giving an indication of an electrical contact between a probe tip and the cleaning solution.

7. An apparatus as claimed in claim 6, characterized in that the container is connected by a pump to a reservoir for the cleaning solution and is provided with an overflow connected to the reservoir.

8. An apparatus as claimed in claim 5, characterized in that the container is connected by a pump to a reservoir for the cleaning solution and is provided with an overflow connected to the reservoir.

* * * * *